(12) United States Patent
Kuan

(10) Patent No.: US 8,842,444 B2
(45) Date of Patent: Sep. 23, 2014

(54) ELECTRONIC DEVICE WITH FIXING STRUCTURE

(75) Inventor: Chang-Ming Kuan, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 258 days.

(21) Appl. No.: 13/335,956

(22) Filed: Dec. 23, 2011

(65) Prior Publication Data

US 2013/0135842 A1 May 30, 2013

(30) Foreign Application Priority Data

Nov. 25, 2011 (TW) .................................. 100222295

(51) Int. Cl.
*H02B 1/01* (2006.01)
*H05K 7/00* (2006.01)

(52) U.S. Cl.
USPC .. 361/825; 361/679.02; 361/725; 248/231.91

(58) Field of Classification Search
CPC ............................. F16M 13/02; H05K 5/0204
USPC ......... 361/679.02; 292/53, 54, 136, 189, 238, 292/289–298; 248/476, 477, 485–487, 489, 248/496, 497; 24/455, 467
See application file for complete search history.

(56) References Cited

U.S. PATENT DOCUMENTS

| | | | | |
|---|---|---|---|---|
| 4,398,647 A | * | 8/1983 | Ackerman | 220/3.9 |
| 6,222,123 B1 | * | 4/2001 | Schwarz | 174/60 |
| 2013/0181102 A1 | * | 7/2013 | Tooley et al. | 248/205.3 |

* cited by examiner

*Primary Examiner* — Jayprakash N Gandhi
*Assistant Examiner* — Mukund G Patel
(74) *Attorney, Agent, or Firm* — Novak Druce Connolly Bove + Quigg LLP

(57) ABSTRACT

A fixing structure is configured on a back cover of an electronic device and engages with a first fastener and a second fastener to hang the electronic device on the wall. The fixing structure includes a first fixing hole and a second fixing hole respectively running through the back cover to receive the two fasteners. The first fixing hole includes a first receiving portion, a first guiding portion and a second guiding portion. The second fixing hole includes a second receiving portion, a first sliding portion, a second sliding portion and a third sliding portion communicating end to end. The first sliding portion is parallel with or collinear with the first guiding portion, the second sliding portion is parallel with the second guiding portion, and the third sliding portion is parallel with the first sliding portion.

20 Claims, 11 Drawing Sheets

ELECTRONIC DEVICE WITH FIXING STRUCTURE

BACKGROUND

1. Technical Field

The present disclosure relates to electronic devices, and more particularly to an electronic device with a fixing structure.

2. Description of Related Art

Many electronic devices, such as IP phones, or LCD TVs, are mounted on walls by use of bolts or other fasteners. Generally, these electronic devices are configured with gourd holes where the bolts or fasteners pass through the gourd holes to hang the electronic devices on the walls. However, the electronic devices can be easily removed from walls if there are no locking assemblies or fittings to prevent the electronic devices from swinging or falling.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
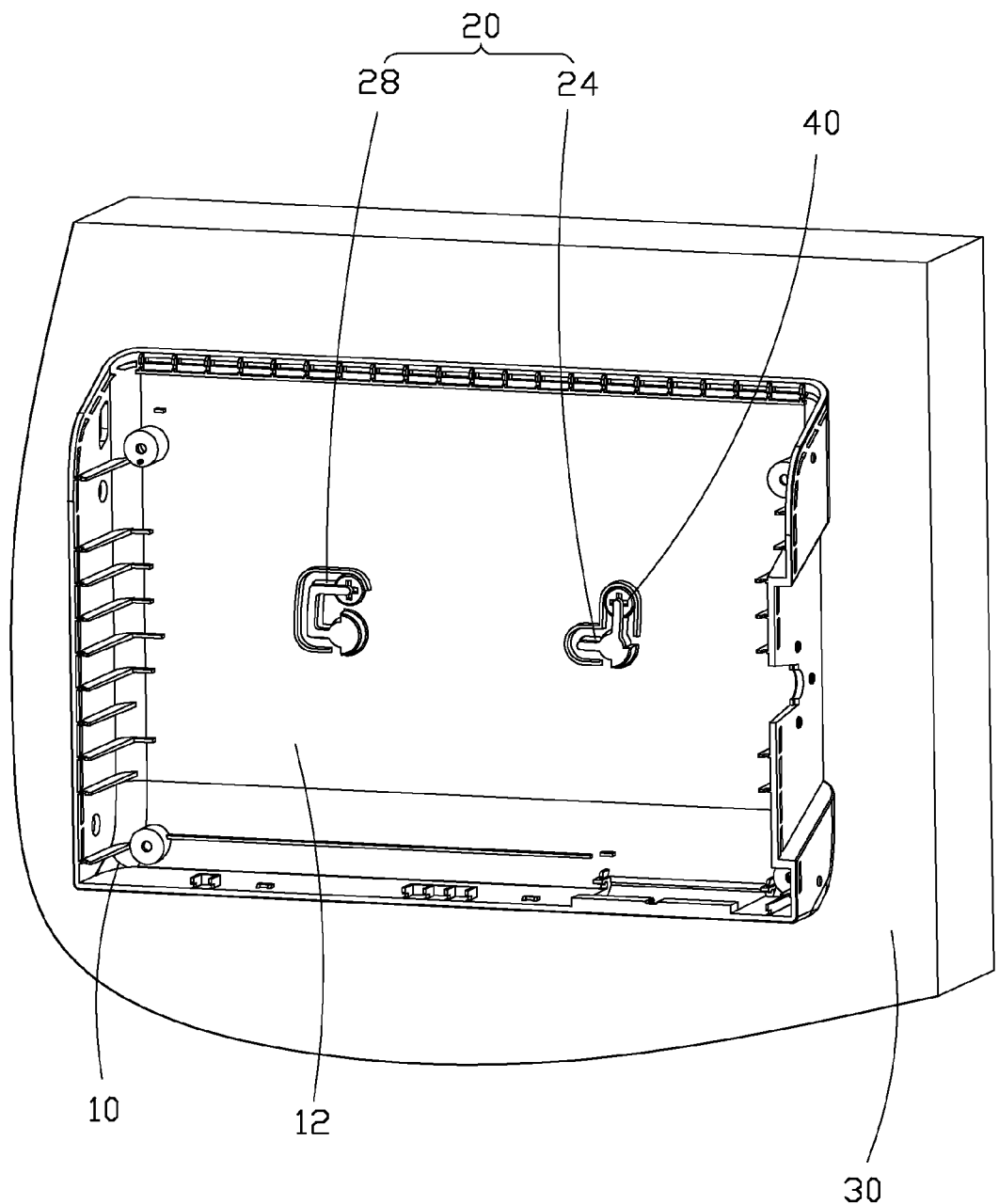
FIG. 1 is a perspective view of an exemplary embodiment of an electronic device hanging on a wall in accordance with the present disclosure, showing a fixing structure engaging with fasteners.

FIG. 1 is a perspective view of an exemplary embodiment of an electronic device 10 hanging on a wall 30 in accordance with the present disclosure, showing a fixing structure 20 engaging with fasteners (two fasteners 40). The electronic device 10, may be but is not limited to a phone, a router, a switch, or an LCD TV, for example. The electronic device 10 comprises a back cover 12 and a fixing structure 20 configured on the back cover 12 to hang the electronic device 10 on the wall 30 using the two fasteners 40, such as screws, bolts or other fasteners.

The fixing structure 20 comprises a first fixing part 24 and a second fixing part 28 constructed with the first fixing part 24 in pairs. The first fixing part 24 and the second fixing part 28 respectively engage with two fasteners 40 to hang the electronic device 10 on the wall 30.

Figure 2:
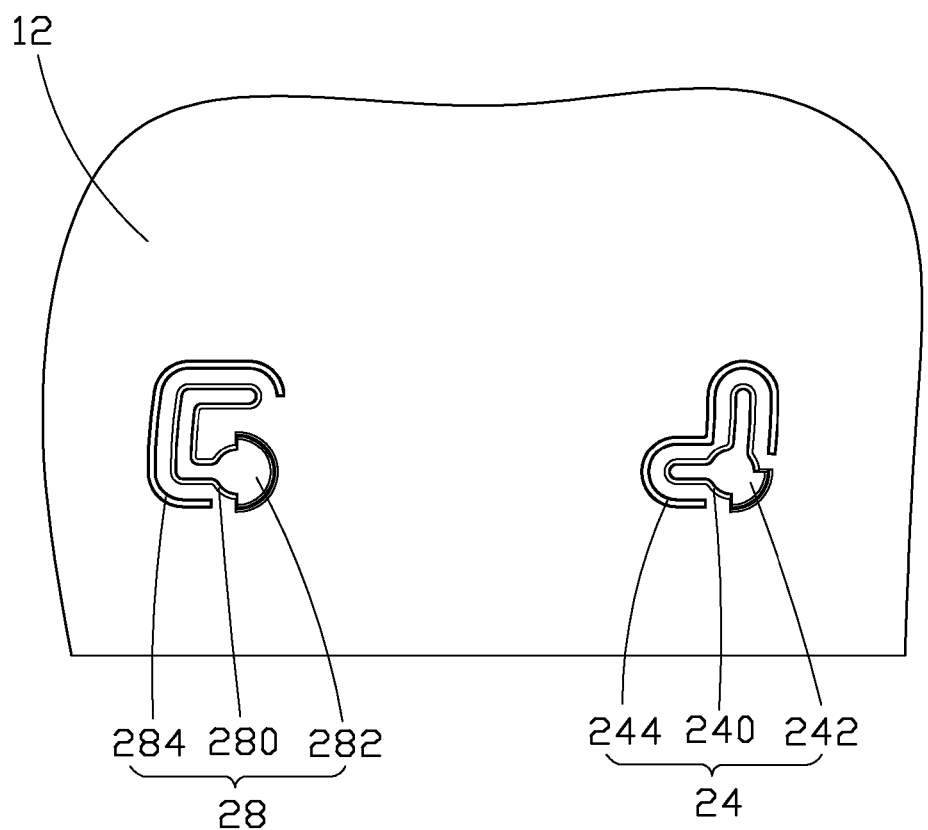
FIG. 2 is a plan view of the fixing structure of FIG. 1 viewed from one side of the electronic device.
Figure 3:
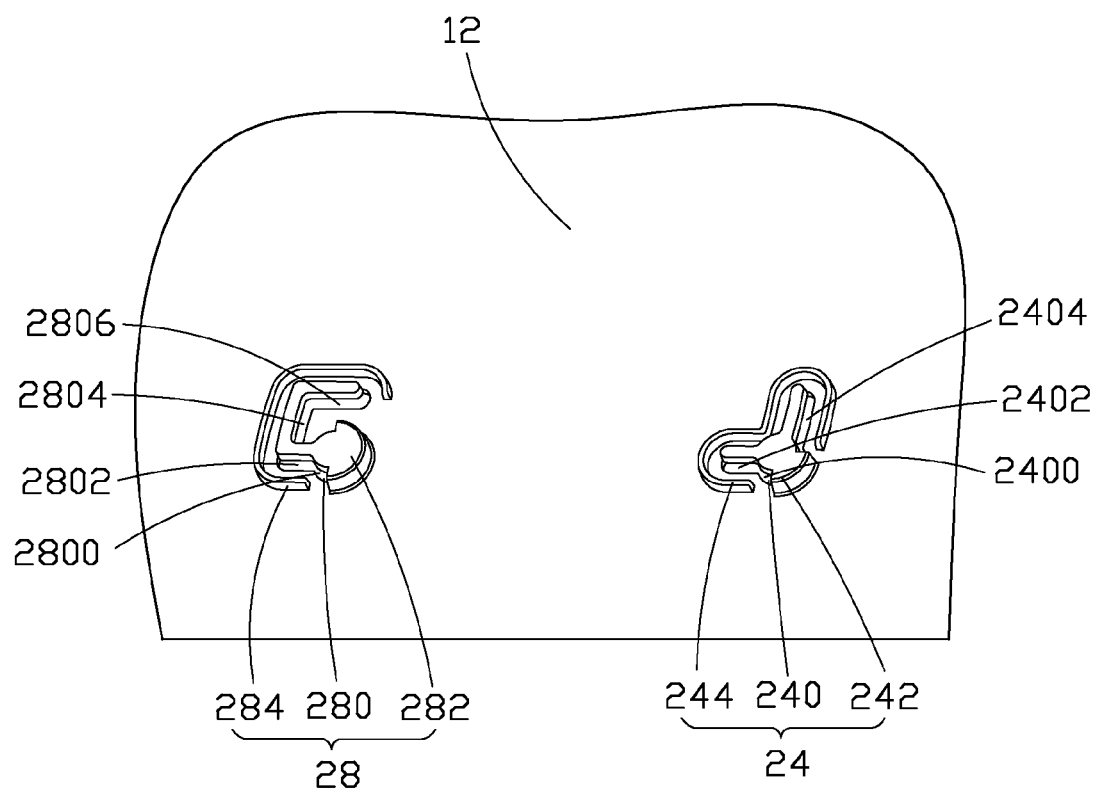
FIG. 3 is a perspective view of the fixing structure of FIG. 1.

In FIG. 2 and FIG. 3, the first fixing part 24 defines a first fixing hole 240 and the second fixing part 28 defines a second fixing hole 280. The first fixing hole 240 and the second fixing hole 280 both run through the back cover 12.

Figure 4:
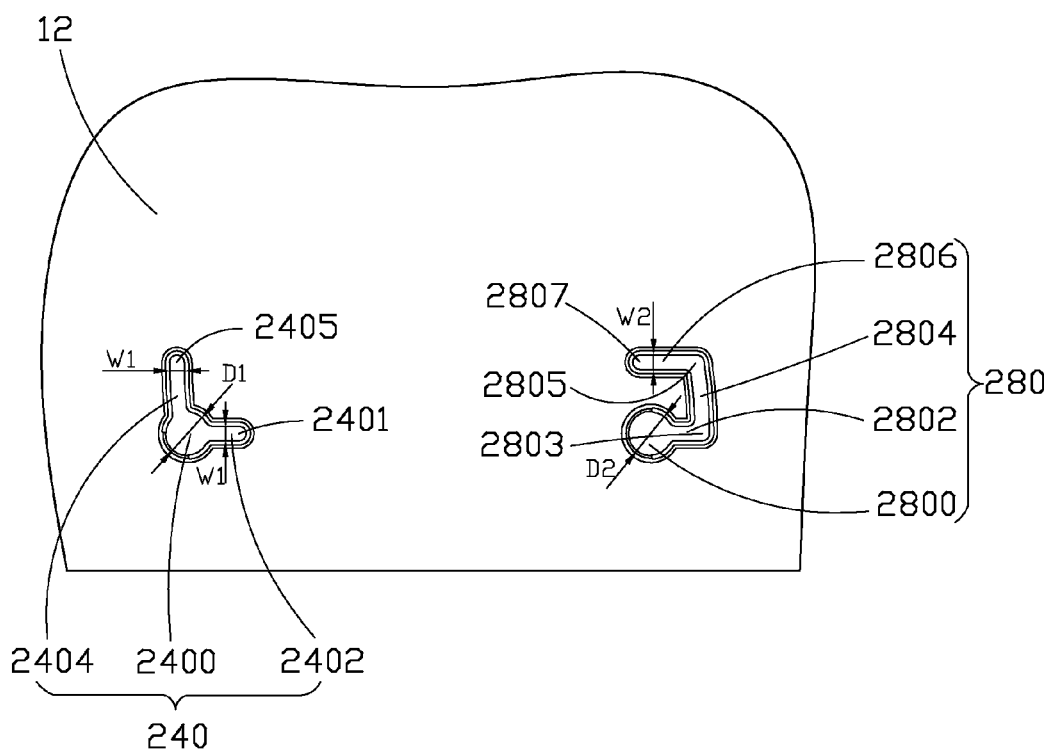
FIG. 4 is a plan view of the fixing structure of FIG. 1 viewed from the the other side of the electronic device.

In FIG. 4, the first fixing hole 240 comprises a first receiving portion 2400, a first guiding portion 2402 and a second guiding portion 2404. The first guiding portion 2402 and the second guiding portion 2404 respectively extend from and communicate with the first receiving portion 2400. That is, the first receiving portion 2400 is configured on an intersection between the first guiding portion 2402 and the second guiding portion 2404. A diameter D1 of the first receiving portion 2400 is greater than widths W1 of the first guiding portion 2402 and the second guiding portion 2404, a head portion of the fastener 40 passes through the first receiving portion 2400 and a pole portion of the fastener 40 move in the first guiding portion 2402 or the second guiding portion 2404 to mount the electronic device 10 to the fastener 40. In the illustrated embodiment, the first receiving portion 2400, the first guiding portion 2402 and the second guiding portion 2404 collectively form a V-shaped or an L shaped structure.

The first fixing hole 240 further comprises a first positioning portion 2401 and a first latching portion 2405. The first positioning portion 2401 is configured at an end of the first guiding portion 2402 away from the first receiving portion 2400, and the first latching portion 2405 is configured at an end of the second guiding portion 2404 away from the first receiving portion 2400. In the illustrated embodiment, the first positioning portion 2401, the first receiving portion 2400 and the first latching portion 2405 are three points of a right-angle triangle, wherein the first guiding portion 2402 and the second guiding portion 2404 are configured on two right-angle sides of the right-angle triangle.

In other embodiments, the first positioning portion 2401, the first receiving portion 2400 and the first latching portion 2405 can be three points of a non-right-angled triangle, where the first guiding portion 2402 and the second guiding portion 2404 are configured on two adjacent sides of the triangle having a common point located at the first receiving portion 2400.

The second fixing hole 280 comprises a second receiving portion 2800, a first sliding portion 2802 communicating with the second receiving portion 2800, a second sliding portion 2804 communicating with the first sliding portion 2802, and a third sliding portion 2806 communicating with the second sliding portion 2804. The second receiving portion 2800, the first sliding portion 2802, the second sliding portion 2804 and the third sliding portion 2806 collectively communicate end to end. The second receiving portion 2800 is configured at an end of the first sliding portion 2802 away from the second sliding portion 2804, and is also configured at an end of the second fixing hole 280 contiguous with the first receiving portion 2400 to be situated on a same horizontal line with the first receiving portion 2400. The first sliding portion 2802 extends from a side of the second receiving portion 2800 and is parallel with or collinear with the first guiding portion 2402, wherein an extending direction of the first guiding portion 2402 from the first receiving portion 2400 is the same with that of the first sliding portion 2802 from the second receiving portion 2800. The second sliding portion 2804 extends from an end of the first sliding portion 2802 away from the second receiving portion 2800, and is perpendicularly parallel with the second guiding portion 2404. The third sliding portion 2806 extends from an end of the second sliding portion 2804 away from the first sliding portion 2802, and is parallel with the first sliding portion 2802. The first sliding portion 2802 and the third sliding portion 2806 are configured on a same side of the second sliding portion 2804. A diameter D2 of the second receiving portion 2800 is greater than widths W2 of the first sliding portion 2802, the second sliding portion 2804 and the third sliding portion 2806, the head portion of the other fastener 40 passes through the second receiving portion 2800 and the pole portion of the other fastener 40 moves in the first sliding portion 2802, the second sliding portion 2804 and the third sliding portion 2806, to mount the electronic device 10 onto the other fastener 40. In the illustrated embodiment, the second receiving portion 2800, the first sliding portion 2802, the second sliding portion 2804 and the third sliding portion 2806 cooperatively form a U-shaped structure.

The second fixing hole 280 further comprises a second positioning portion 2803, a third positioning portion 2805 and a second latching portion 2807. The second positioning portion 2803 is configured at an end of the first sliding portion 2802 away from the second receiving portion 2800. That is, the second positioning portion 2803 is configured on an intersection between the first sliding portion 2802 and the second sliding portion 2804. Similarly, the third positioning portion 2805 is configured at an end of the second sliding portion 2804 away from the first positioning portion 2803. That is, the third positioning portion 2805 is configured on an intersection between the second sliding portion 2804 and the third sliding portion 2806. The second latching portion 2807 is configured at an end of the third sliding portion 2806 away from the second positioning portion 2805, and is also configured at the end of the second fixing hole 280 contiguous with the first latching portion 2405 to be situated on a same horizontal line with the first latching portion 2405. The second latching portion 2807 is situated on a same perpendicular line with the second receiving portion 2800, that is, a line formed by the second latching portion 2807 and the second receiving portion 2800 is parallel with the second sliding portion 2804, and is also parallel with the second guiding portion 2404. Length of the second sliding portion 2804 is equal to length of the second guiding portion 2404.

In the illustrated embodiment, the second receiving portion 2800, the second positioning portion 2803, the third positioning portion 2805 and the second latching portion 2807 form a rectangle, and the first sliding portion 2802, the second sliding portion 2804 and the third sliding portion 2806 are three end-to-end lines of the rectangle, that is, the first sliding portion 2802 and the third sliding portion 2806 are two adjacent lines of the second sliding portion 2804 in the rectangle.

In other embodiments, the second receiving portion 2800, the second positioning portion 2803, the third positioning portion 2805 and the second latching portion 2807 form a parallelogram having no right angle, and the first sliding portion 2802 and the third sliding portion 2806 are two adjacent lines of the second sliding portion 2804 in the parallelogram.

A distance between one point of the first fixing hole 240 and the corresponding point of the second fixing hole 280 is equal to a distance between centers of the first receiving portion 2400 and the second receiving portion 2800. For example, a distance between centers of the first positioning portion 2401 and the second positioning portion 2803 and a distance between centers of the first latching portion 2405 and the second latching portion 2807 are respectively about equal to a distance between centers of the first receiving portion 2400 and the second receiving portion 2800.

Figure 5:
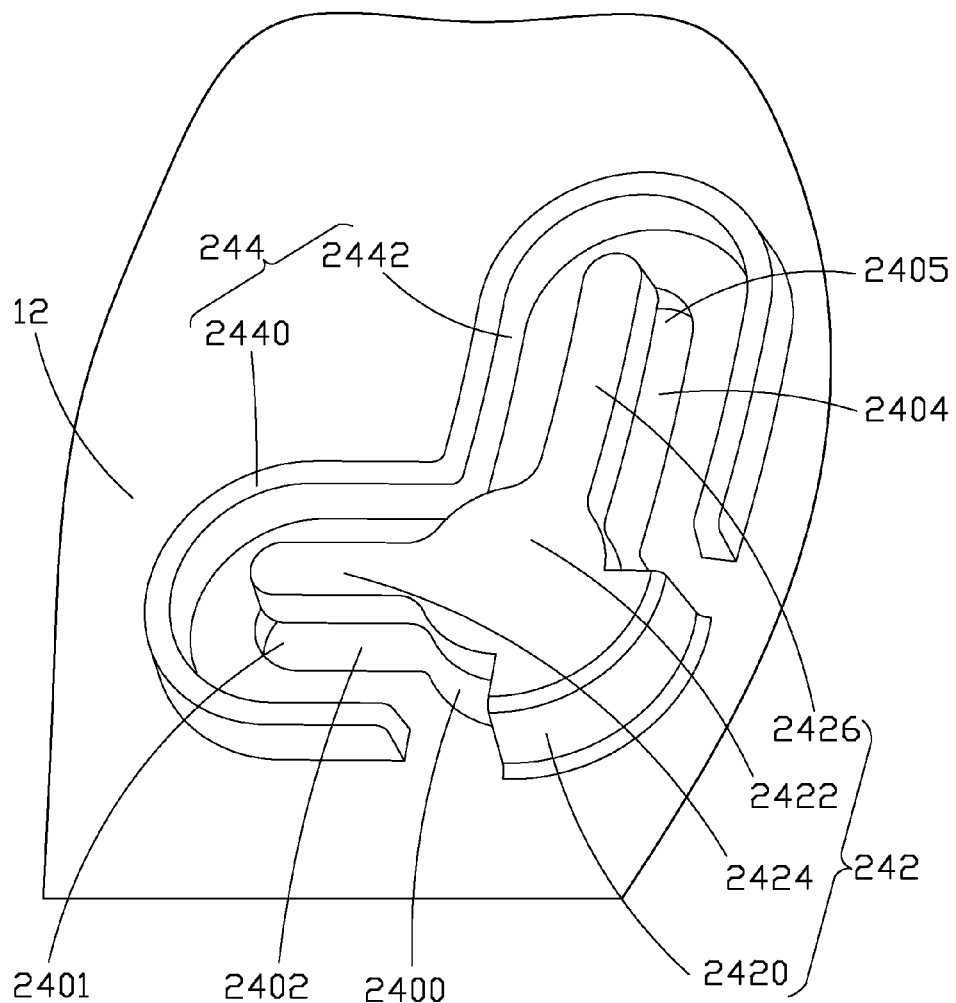
FIG. 5 is an enlarged perspective view of a first fixing part of FIG. 3.

In FIG. 5, the first fixing part 24 further comprise a first guiding rib 242 and a first strengthening rib 244 protruding inwardly from inner surface of the back cover 12. A projection of the first guiding rib 242 onto the back cover 12 superposes in the first fixing hole 240 to prevent the fastener 40 excessively being inserted into the electronic device 10. The first strengthening rib 244 surrounds the first fixing hole 240 and enhances mechanism intension of the first fixing hole 240. In the illustrated embodiment, the first guiding rib 242 and the first strengthening rib 244 are integrally formed with the back cover 12.

The first guiding rib 242 comprises a first protruding portion 2420, a first resisting portion 2422, a first extending portion 2424 and a second extending portion 2426. The first protruding portion 2420 protrudes inwardly from the back cover 12 to surround the first receiving portion 2400, and is configured on different sides of the first receiving portion 2400 with the first guiding portion 2402 and the second guiding portion 2404. The first resisting portion 2422 is bent from an end of the first protruding portion 2420 away from the back cover 12 and opposites to the first receiving portion 2400, and the projection of the first resisting portion 2422 onto the back cover 12 superposes in the first receiving portion 2400. The first extending portion 2424 extends from the first resisting portion 2422 and opposites to the first positioning portion 2401 and the first guiding portion 2402. Similarly, the second extending portion 2426 extends from the first resisting portion 2422 and opposites to the first latching portion 2405 and the second guiding portion 2404. The first resisting portion 2422, the first extending portion 2424 and the second extending portion 2426 are coplanar and are cooperatively parallel with the back cover 12. In the illustrated embodiment, the first resisting portion 2422, the first extending portion 2424 and the second extending portion 2426 are substantially formed in a V-shape or an L-shape.

The first strengthening rib 244 comprises a first strengthening portion 2440 and a second strengthening portion 2442. The first strengthening portion 2440 is close to and surrounds the first guiding portion 2402 and the first extending portion 2424, and the second strengthening portion 2442 is close to and surrounds the second guiding portion 2404 the second extending portion 2426. In the illustrated embodiment, the first strengthening portion 2440 connects with the second strengthening portion 2442. When the fastener 40 moving in the first guiding portion 2402, the head portion of the fastener 40 passes through the first guiding portion 2402 to resist with the first extending portion 2424 and is surrounded by the first strengthening portion 2442. Similarly, when the fastener 40 moving in the second guiding portion 2404, the head portion of the fastener 40 passes through the second guiding portion 2404 to resist with the second extending portion 2426 and is surrounded by the second strengthening portion 2626. In the illustrated embodiment, the first strengthening portion 2440 and the second strengthening portion 2442 are substantially U-shaped or C-shaped, and the first strengthening rib 244 is substantially V-shaped or L-shaped.

Figure 6:
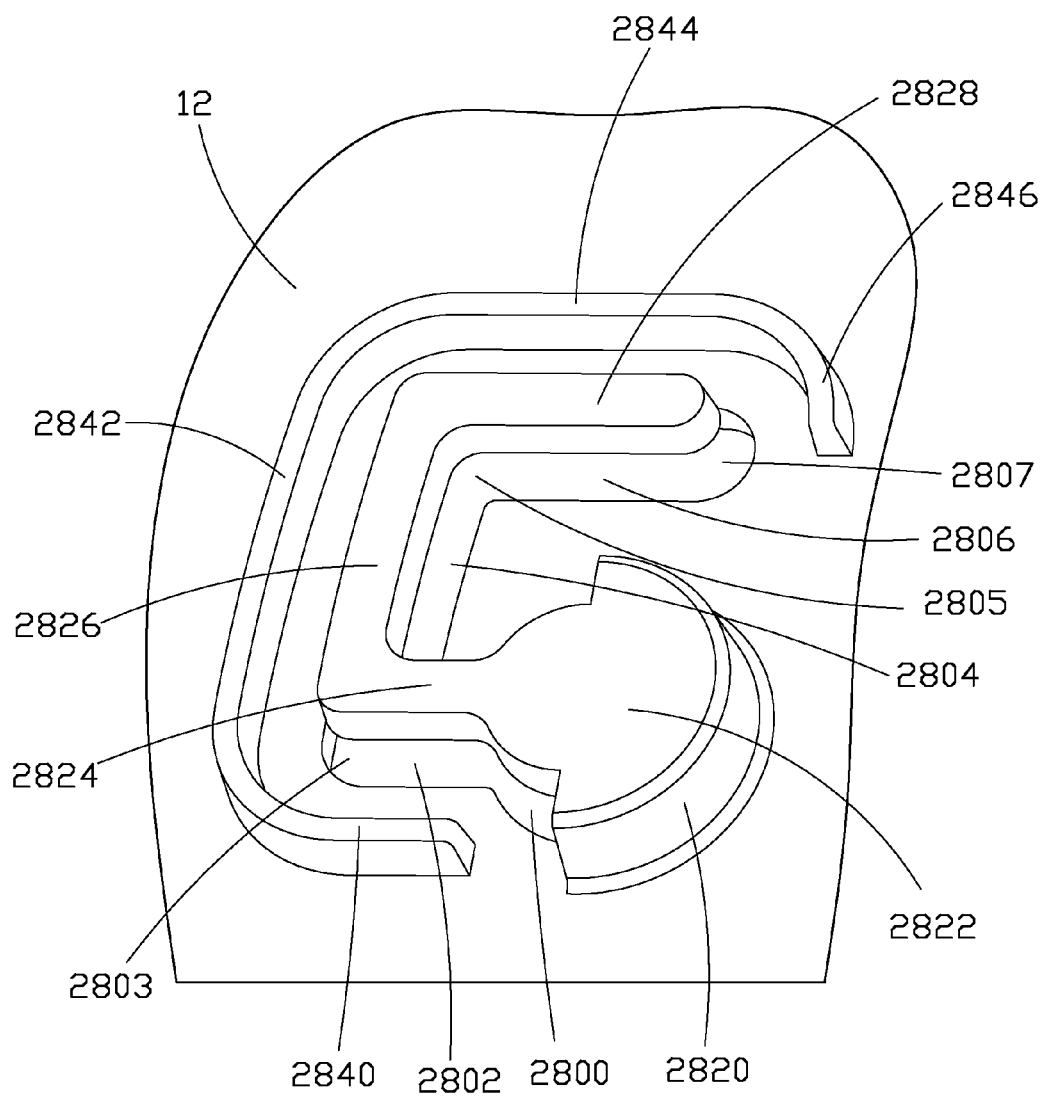
FIG. 6 is an enlarged perspective view of a second fixing part of FIG. 3.

Referring to FIG. 6, the second fixing part 28 further comprises a second guiding rib 282 and a second strengthening rib 284 protruding inwardly from inner surface of the back cover 12. A projection of the second guiding rib 282 onto the back cover 12 superposes in the second fixing hole 280 to prevent the fastener 40 excessively being inserted into the electronic device 10. The second strengthening rib 284 surrounds the second fixing hole 280 and enhances mechanism intension of the second fixing hole 280. In the illustrated embodiment, the second guiding rib 282 and the second strengthening rib 284 are integrally formed with the back cover 12.

The second guiding rib 282 comprises a second protruding portion 2820, a second resisting portion 2822, a third extending portion 2824, a forth extending portion 2826 and a fifth extending portion 2828. The second protruding portion 2820 protrudes inwardly from the back cover 12 to be configured on one side of the second receiving portion 2800. The second resisting portion 2822 is bent from an end of the second protruding portion 2820 away from the back cover 12 and opposites to the second receiving portion 2800, and the projection of the second resisting portion 2822 onto the back cover 12 superposes in the second receiving portion 2800. The third extending portion 2824 extends from the second resisting portion 2822 and opposites to the second positioning portion 2803 and the first sliding portion 2802. The forth extending portion 2826 extends from an end of the third extending portion 2824 away from the second resisting portion 2822 and opposites to the third positioning portion 2805 and the second sliding portion 2804. Similarly, the fifth extending portion 2828 extends from an end of the forth extending portion 2826 away from the third extending portion 2824 and opposites to the second latching portion 2807 and the third sliding portion 2806. The second resisting portion 2822, the third extending portion 2824, the forth extending portion 2826 and the fifth extending portion 2828 are coplanar and are cooperatively parallel with the back cover 12. In the illustrated embodiment, the second resisting portion 2822, the third extending portion 2824, the forth extending portion 2826 and the fifth extending portion 2828 are substantially formed in a U-shape or a C-shape.

The second strengthening rib 284 comprises a first strengthening segment 2840, a second strengthening segment 2842, a third strengthening segment 2844 and a forth strengthening segment 2846. The first strengthening segment 2840 extends along the first sliding portion 2802 in parallel with one end contiguous with the second receiving portion 2800, and locates on a side of the first sliding portion 2802 away from the third sliding portion 2806. The second strengthening segment 2842 is bent from one end of the first strengthening segment 2840 away from the second receiving portion 2800, extends along the second sliding portion 2804 in parallel, and is located on a side of the second sliding portion 2804 away from the first fixing part 24. The third strengthening segment 2844 is bent from one end of the second strengthening segment 2842 away from the first strengthening segment 2840, extends along the third sliding portion 2806 in parallel, and is located on a side of the third sliding portion 2806 away from the first sliding portion 2802. The forth strengthening segment 2846 is bent from an end of the third strengthening segment 2844 away from the second strengthening segment 2842 and surrounds the second latching portion 2807.

When the fastener 40 moves in the first sliding portion 2802, the head portion of the fastener 40 passes through the first sliding portion 2802 to resist with the third extending portion 2824 and is close to the first strengthening segment 2840. When the fastener 40 moves in the second sliding portion 2804, the head portion of the fastener 40 passes through the second sliding portion 2804 to resist with the forth extending portion 2826 and is close to the second strengthening segment 2842. Similarly, when the fastener 40 moves in the third sliding portion 2806, the head portion of the fastener 40 passes through the third sliding portion 2806 to resist with the fifth extending portion 2828 and is close to the third strengthening segment 2844. In the illustrated embodiment, the first strengthening segment 2840, the second strengthening segment 2842, the third strengthening segment 2844 and the forth strengthening segment 2846 are substantially U-shaped or C-shaped.

FIGS. 7A-7E illustrate five successive stages of an exemplary process of hanging the electronic device 10 on the wall 30 in accordance with the present disclosure.

Figure 7A:
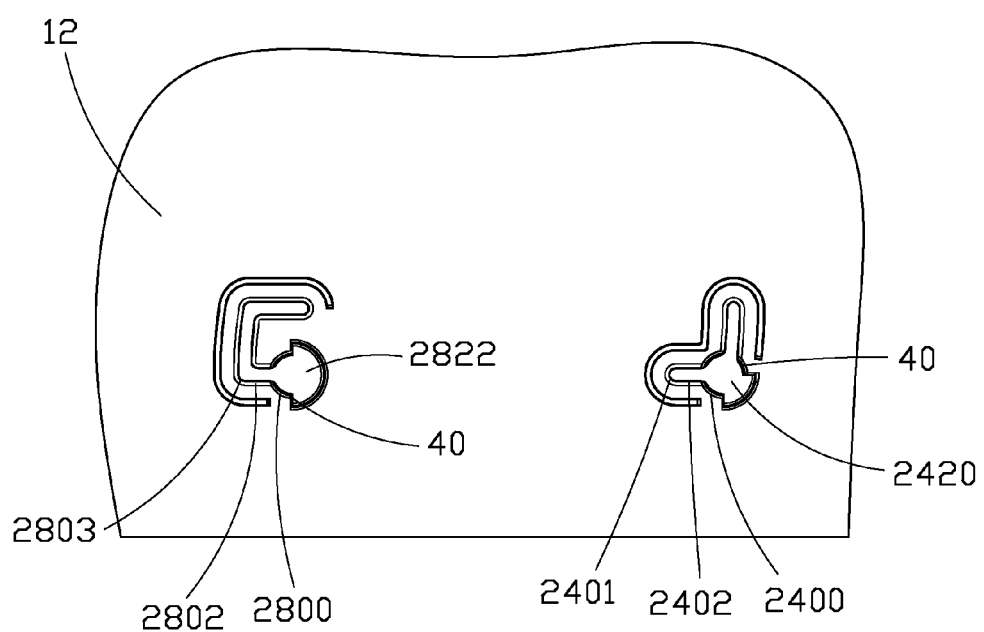
FIGS. 7A-7E illustrate five successive stages of an exemplary process of hanging the electronic device on the wall in accordance with the present disclosure.

When the electronic device 10 is fixed on the wall 30 by the fasteners 40, the head portion of one fastener 40 passes through the first receiving portion 2400 to resist on the first resisting portion 2422, and the head portion of the other fastener 40 passes through the second receiving portion 2800 to resist on the second resisting portion 2822, as shown in FIG. 7A.

Figure 7B:
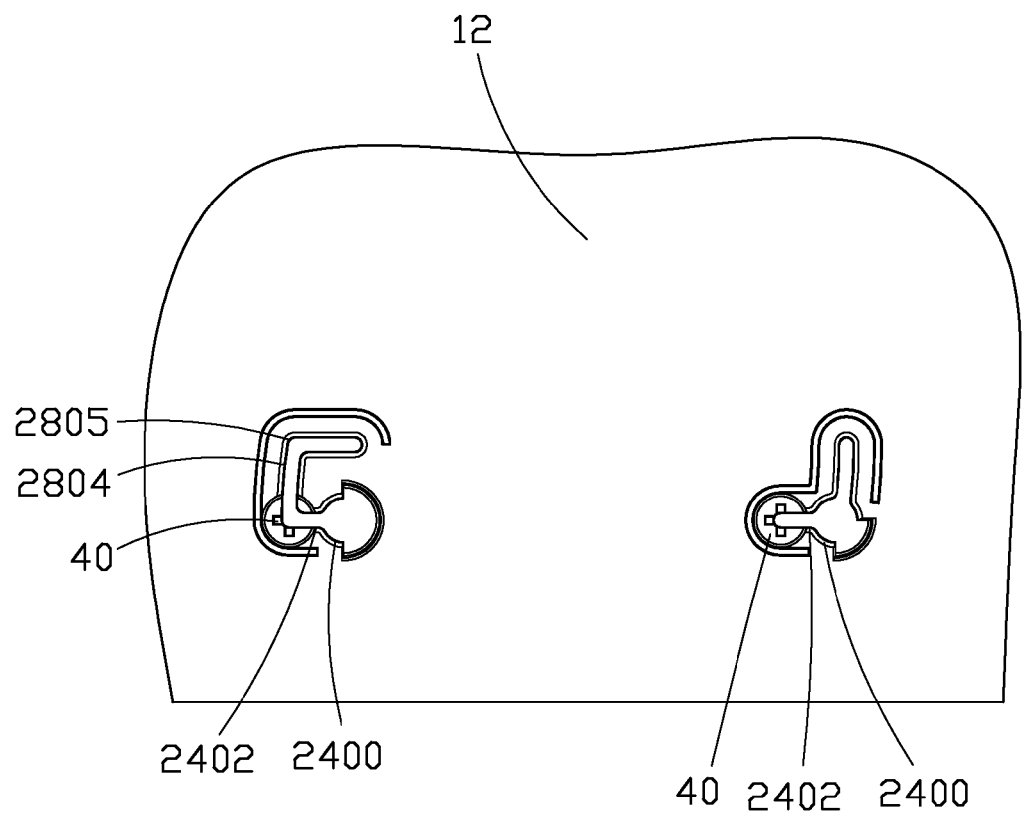

The electronic device 10 is moved from the first receiving portion 2400 along a direction of the first guiding portion 2402 to the first positioning portion 2401 receiving one fastener 40, and is synchronously moved from the second receiving portion 2800 along a direction of the first sliding portion 2802 to the second positioning portion 2803 receiving the other fastener 40, as shown in FIG. 7B.

Under the gravity of the electronic device 10, one side of the electronic device 10 moves from the second positioning portion 2803 along the second sliding portion 2804 to the third positioning portion 2805, which receives the fastener 40, the other side of the electronic device 10 is hold by the other fastener 40 engaging with the first positioning portion 2401. Herein, the electronic device 10 is inclined on the wall 30, as shown in FIG. 7C.

Figure 7C:
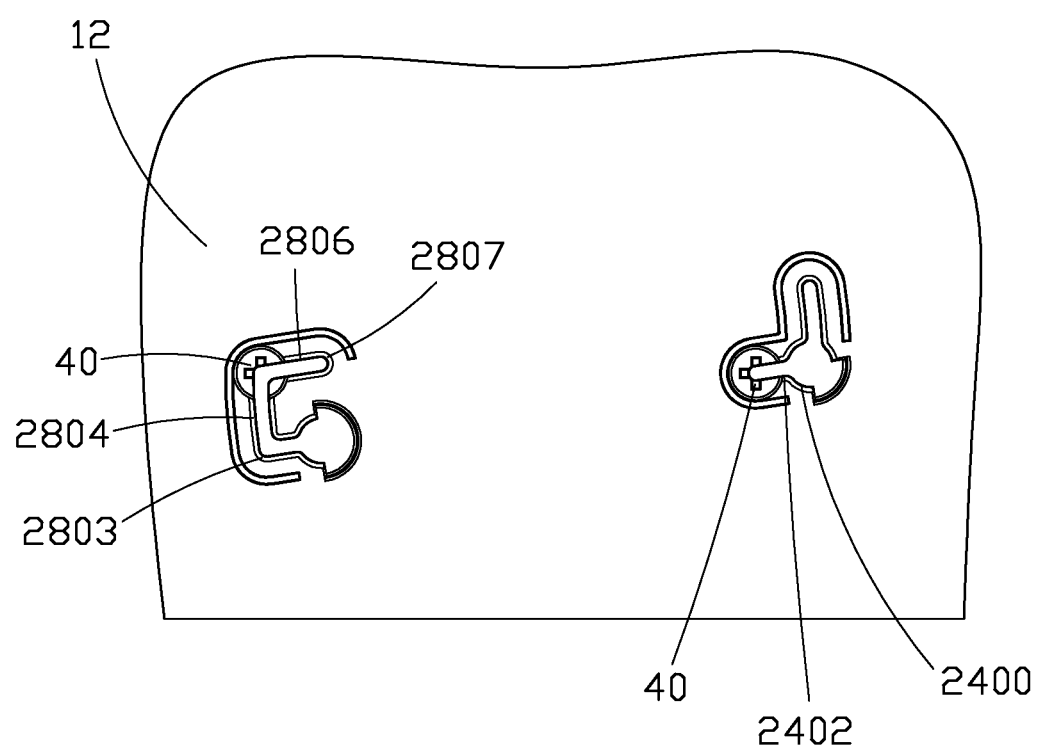
Figure 7D:
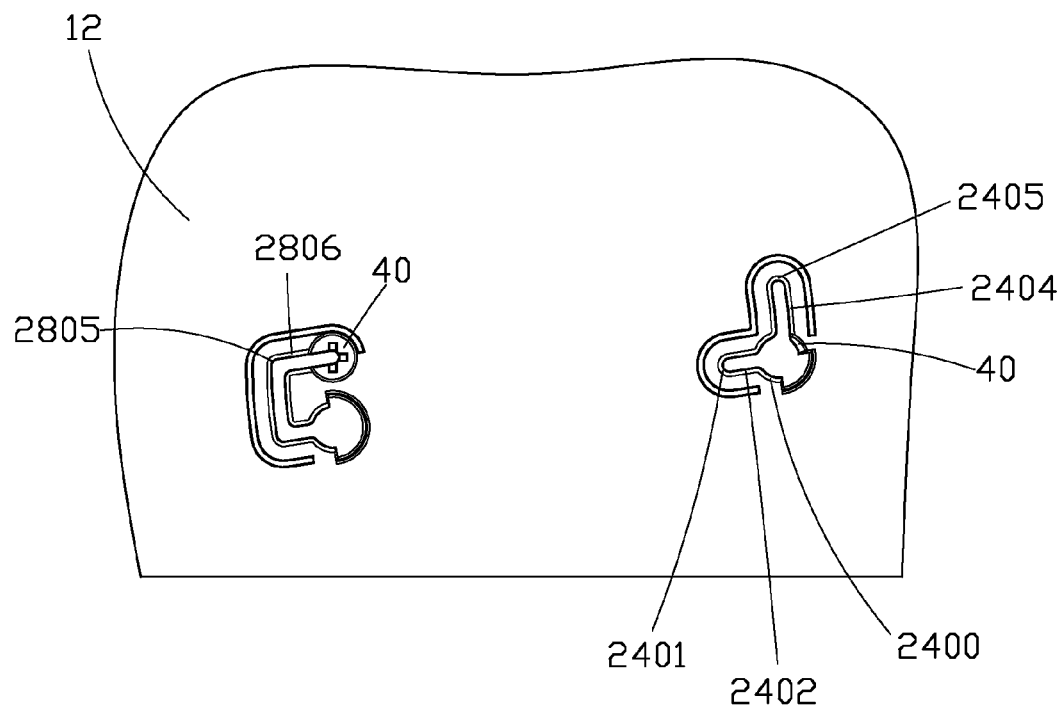
Figure 7E:
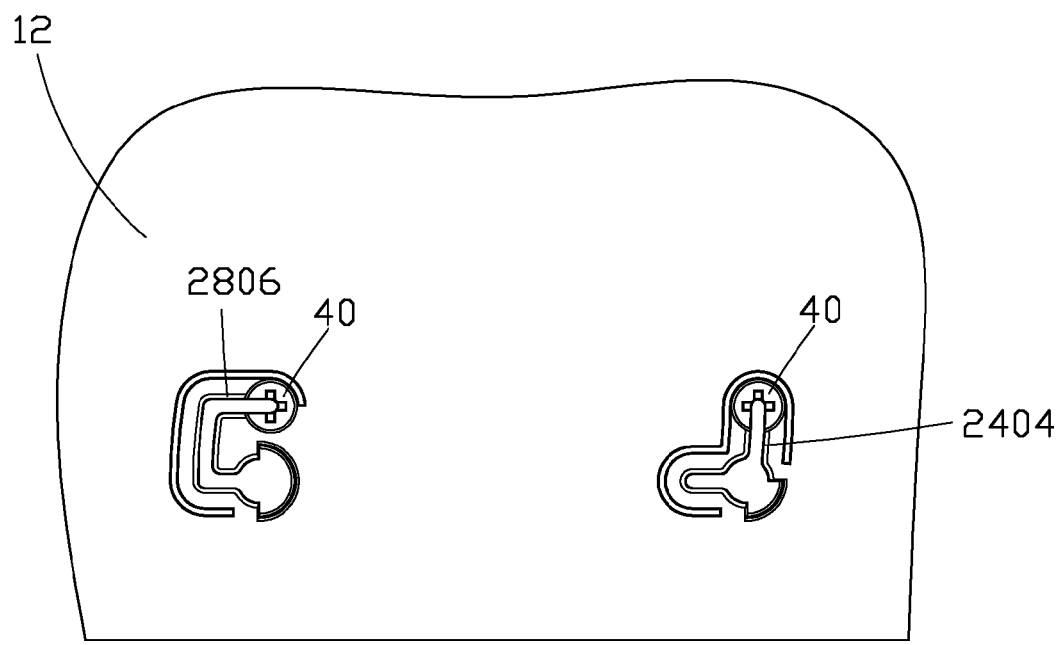

The electronic device 10 is moved from the first positioning portion 2401 along a direction of the first guiding portion 2402 to the first receiving portion receiving one fastener 40, and is synchronously moved from the third positioning portion 2805 along a direction of the third sliding portion 2806 to the second latching portion 2807 receiving the other fastener 40, as shown in FIG. 7D.

Under the mass of the electronic device 10, one side of the electronic device 10 moves from the first receiving portion 2400 along a direction of the second guiding portion 2404 to the first latching portion, which receives the fastener 40, the other side of the electronic device 10 is hold by the other fastener 40 engaging with the second latching portion 2807, as shown in FIG. 7C. By finishing these processes, the electronic device 10 is stably hanged on the wall 30 by the fasteners 40.

The fixing structure 20 is in a simple structure, and defines the first fixing hole 240 and the fixing hole 280 cooperatively and receiving the two fasteners 40 to hang the electronic device 10 on the wall 30. It is convenient to hang the electronic device 10 on the wall 30 or remove the electronic device 10 from the wall 30 without tools. In addition, the fixing structure 20 has theft-proof function and needs a specialized worker to operate because of the first fixing hole 240 and the second fixing hole 280 in different shapes.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:
1. A fixing structure, configured on a back cover of an electronic device and engaging with a first fastener and a second fastener for hanging the electronic device on a wall, the fixing structure comprising:
   a first fixing hole, running through the back cover to receive the first fastener, and comprising a first receiving por- tion, a first guiding portion and a second guiding portion, the first receiving portion configured on an intersection between the first guiding portion and the second guiding portion; and a second fixing hole, running through the back cover to receive the second fastener, and comprising a second receiving portion, a first sliding portion, a second sliding portion and a third sliding portion, the second sliding portion communicates with each of the first sliding portion and the third sliding portion, and there is no intersection between the first sliding portion and the third sliding portion, the first sliding portion parallel with or collinear with the first guiding portion, the first sliding portion extending from the second receiving portion along a same direction with the first guiding portion extending from the first receiving portion, the second sliding portion parallel with the second guiding portion, and the third sliding portion parallel with the first sliding portion, the third sliding portion and the first sliding portion are located on the same side of the second sliding portion, and the third sliding portion, the second sliding portion, and the first sliding portion form two intersections; wherein a distance between two points that are respectively defined in the first fixing hole and the second fixing hole is about equal to a distance between the first receiving portion and the second receiving portion.

2. The fixing structure of claim 1, wherein the first fixing hole is V-shaped or L-shaped, and comprises a first positioning portion and a first latching portion, the first positioning portion and the first latching portion are respectively configured at an end of the first guiding portion and an end of the second guiding portion away from the first receiving portion, the first latching portion and the first receiving portion are situated on a same perpendicular line, the first receiving portion and the second receiving portion are situated on a same horizontal line.

3. The fixing structure of claim 2, wherein the first positioning portion, the first receiving portion and the first latching portion form a triangle, and the first guiding portion and the second guiding portion are configured on two adjacent sides of the triangle having a common point located at the first receiving portion.

4. The fixing structure of claim 2, wherein the second fixing hole is U-shaped or C-shaped, and comprises a second positioning portion, a third positioning portion and a second latching portion, the second positioning portion is configured on an intersection between the first sliding portion and the second sliding portion, the third positioning portion is configured on an intersection between the second sliding portion and the third sliding portion, the second latching portion is configured at an end of the third sliding portion away from the second positioning portion to be situated on a same horizontal line with the first latching portion and on a same perpendicular line with the second receiving portion.

5. The fixing structure of claim 4, wherein the second receiving portion, the second positioning portion, the third positioning portion and the second latching portion form a parallelogram, and the first sliding portion, the second sliding portion and the third sliding portion are three end-to-end lines of the rectangle.

6. The fixing structure of claim 2, wherein further comprises a first guiding rib and a first strengthening rib protruding inwardly from the back cover, a projection of the first guiding rib onto the back cover superposes in the first fixing hole, and the first strengthening rib surrounds the first fixing hole.

7. The fixing structure of claim 6, wherein the first guiding rib comprises a first protruding portion, a first resisting portion, a first extending portion and a second extending portion, the first protruding portion protrudes inwardly from the back cover to surround the first receiving portion, the first resisting portion is bent from an end of the first protruding portion away from the back cover and opposites to the first receiving portion, the first extending portion extends from the first resisting portion and opposites to the first positioning portion and the first guiding portion, the second extending portion extends from the first resisting portion and opposites to the first latching portion and the second guiding portion.

8. The fixing structure of claim 7, wherein the first strengthening rib comprises a first strengthening portion and a second strengthening portion, the first strengthening portion is close to and surrounds the first guiding portion and the first extending portion, and the second strengthening portion is close to and surrounds the second guiding portion and the second extending portion.

9. The fixing structure of claim 4, wherein further comprises a second guiding rib and a second strengthening rib protruding inwardly from the back cover, a projection of the second guiding rib onto the back cover superposes in the second fixing hole, and the second strengthening rib surrounds the second fixing hole.

10. The fixing structure of claim 9, wherein the second guiding rib comprises a second protruding portion, a second resisting portion, a third extending portion, a forth extending portion and a fifth extending portion, the second protruding portion protruding inwardly from the back cover to surround the second receiving portion, the second resisting portion is bent from an end of the second protruding portion away from the back cover and opposites to the second receiving portion, the third extending portion extends from the second resisting portion and opposites to the second positioning portion and the first sliding portion, the forth extending portion extends from the third extending portion and opposites to the third positioning portion and the second sliding portion, and the fifth extending portion extends from the forth extending portion and opposites to the second latching portion and the third sliding portion.

11. The fixing structure of claim 9, wherein the second strengthening rib comprises a first strengthening segment, a second strengthening segment, a third strengthening segment and a forth strengthening segment, the first strengthening segment extends along the first sliding portion in parallel with one end contiguous with the second receiving portion, the second strengthening segment is bent from the first strengthening segment to extend along the second sliding portion in parallel, the third strengthening segment is bent from the second strengthening segment to extending along the third sliding portion in parallel, and the forth strengthening segment is bent from the third strengthening segment to surround the second latching portion.

12. A fixing structure, configured on a back cover of an electronic device and engaging with a first fastener and a second fastener for hanging the electronic device on a wall, the fixing structure comprising:

a first fixing hole, running through the back cover to receive the first fastener, and comprising a first receiving portion, a first guiding portion, and a second guiding portion, the first receiving portion being configured on an intersection between the first guiding portion and the second guiding portion; and a second fixing hole being U-shaped or C-shaped, running through the back cover to receive the second fastener, and comprising a second receiving portion, a first sliding portion, a second sliding portion, and a third sliding portion, the second sliding portion communicating with each of the first sliding portion and the third sliding portion, wherein there is no intersection between the first sliding portion and the third sliding portion the first sliding portion is parallel with or collinear with the first guiding portion, the first sliding portion extends from the second receiving portion along a same direction as the first guiding portion extending from the first receiving portion, the second sliding portion is parallel with the second guiding portion and the third sliding portion is parallel with the first sliding portion, the third sliding portion and the first sliding portion are located on the same side of the second sliding portion, the first sliding portion and the second sliding portion form a second positioning portion, and the second sliding portion and the third sliding portion form a third positioning portion.

13. The electronic device of claim 12, wherein the first fixing hole is V-shaped or L-shaped, and comprises a first positioning portion and a first latching portion, the first positioning portion and the first latching portion are respectively configured at an end of the first guiding portion and an end of the second guiding portion away from the first receiving portion, the first latching portion and the first receiving portion are situated on a same perpendicular line, and the first receiving portion and the second receiving portion are situated on a same horizontal line.

14. The electronic device of claim 13, wherein the second fixing hole further comprises a second latching portion, the second positioning portion is configured on an intersection between the first sliding portion and the second sliding portion, the third positioning portion is configured on an intersection between the second sliding portion and the third sliding portion, and the second latching portion is configured at an end of the third sliding portion away from the second positioning portion to be situated on a same horizontal line as the first latching portion and on a same perpendicular line as the second receiving portion.

15. The electronic device of claim 12, wherein the fixing structure comprises a first guiding rib and a first strengthening rib protruding inwardly from the back cover, a projection of the first guiding rib onto the back cover superposes in the first fixing hole, and the first strengthening rib surrounds the first fixing hole.

16. The electronic device of claim 15, wherein the first guiding rib comprises a first protruding portion, a first resisting portion, a first extending portion, and a second extending portion, the first protruding portion protrudes inwardly from the back cover to surround the first receiving portion, the first resisting portion is bent from an end of the first protruding portion away from the back cover and opposite to the first receiving portion, the first extending portion extends from the first resisting portion and is opposite to the first positioning portion and the first guiding portion, the second extending portion extends from the first resisting portion and opposite to the first latching portion and the second guiding portion.

17. The electronic device of claim 16, wherein the first strengthening rib comprises a first strengthening portion and a second strengthening portion, the first strengthening portion is close to and surrounds the first guiding portion and the first extending portion, and the second strengthening portion is close to and surrounds the second guiding portion and the second extending portion.

18. The electronic device of claim 14, wherein the fixing structure further comprises a second guiding rib and a second strengthening rib protruding inwardly from the back cover, a projection of the second guiding rib onto the back cover superposes in the second fixing hole, and the second strengthening rib surrounds the second fixing hole.

19. The electronic device of claim 18, wherein the second guiding rib comprises a second protruding portion, a second resisting portion, a third extending portion, a fourth extending portion, and a fifth extending portion, the second protruding portion protrudes inwardly from the back cover to surround the second receiving portion, the second resisting portion is bent from an end of the second protruding portion away from the back cover and opposite to the second receiving portion, the third extending portion extends from the second resisting portion and opposite to the second positioning portion and the first sliding portion, the fourth extending portion extends from the third extending portion and opposite to the third positioning portion and the second sliding portion, and the fifth extending portion extends from the fourth extending portion and is opposite to the second latching portion and the third sliding portion.

20. The electronic device of claim 18, wherein the second strengthening rib comprises a first strengthening segment, a second strengthening segment, a third strengthening segment, and a fourth strengthening segment, the first strengthening segment extends parallel along the first sliding portion with one end contiguous with the second receiving portion, the second strengthening segment is bent from the first strengthening segment to extend parallel along the second sliding portion, the third strengthening segment is bent from the second strengthening segment to extend parallel along the third sliding portion, and the fourth strengthening segment is bent from the third strengthening segment to surround the second latching portion.

* * * * *